(12) United States Patent
Haque et al.

(10) Patent No.: US 7,826,554 B2
(45) Date of Patent: Nov. 2, 2010

(54) DIGITAL TRANSMITTER

(75) Inventors: Tanbir Haque, Jackson Heights, NY (US); Leonid Kazakevich, Plainview, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 665 days.

(21) Appl. No.: 11/685,003

(22) Filed: Mar. 12, 2007

(65) Prior Publication Data

US 2007/0211821 A1   Sep. 13, 2007

Related U.S. Application Data

(60) Provisional application No. 60/781,703, filed on Mar. 13, 2006.

(51) Int. Cl.
*H04K 1/02* (2006.01)

(52) U.S. Cl. ...................................... 375/297

(58) Field of Classification Search ................. 375/247, 375/261, 295, 297, 308
See application file for complete search history.

(56) References Cited

U.S. PATENT DOCUMENTS

| | | | |
|---|---|---|---|
| 5,511,069 A * | 4/1996 | England et al. ............. 370/276 |
| 5,534,828 A * | 7/1996 | Okada et al. ................ 332/103 |
| 5,627,499 A | 5/1997 | Gardner |
| 6,169,761 B1 * | 1/2001 | Marcoccia et al. .......... 375/132 |
| 6,339,621 B1 | 1/2002 | Cojocaru et al. |
| 6,560,296 B1 | 5/2003 | Glas et al. |
| 6,587,010 B2 * | 7/2003 | Wagh et al. .................. 332/105 |
| 6,801,784 B1 * | 10/2004 | Rozenblit et al. ........... 455/522 |
| 7,092,269 B1 * | 8/2006 | Westberg .................... 363/132 |
| 7,158,494 B2 | 1/2007 | Sander et al. |
| 2004/0081252 A1 | 4/2004 | Hsu |
| 2004/0203472 A1 * | 10/2004 | Chien .......................... 455/68 |
| 2005/0123029 A1 * | 6/2005 | Vorenkamp et al. ......... 375/222 |
| 2005/0135282 A1 * | 6/2005 | Miyoshi et al. ............. 370/278 |
| 2007/0030196 A1 * | 2/2007 | Jenkins et al. ........... 342/357.1 |
| 2007/0218934 A1 * | 9/2007 | Osaki .......................... 455/522 |
| 2009/0034660 A1 * | 2/2009 | May et al. ................... 375/340 |
| 2009/0275290 A1 * | 11/2009 | Hosokawa ............... 455/67.13 |

\* cited by examiner

*Primary Examiner*—David C Payne
*Assistant Examiner*—Leon-Viet Q Nguyen
(74) *Attorney, Agent, or Firm*—Volpe and Koenig PC

(57) ABSTRACT

In a digital Cartesian modulation transmitter, an encoder generates 1-bit logic signals from in-phase and quadrature signals. A single bit digital modulator multiplexes the 1-bit logic signals for Cartesian I/Q modulation. A digital upconverter (DUC) upconverts the multiplexed 1-bit logic signal. A digital power amplifier (DPA) generates a radio frequency (RF) signal based on the upconverted signal. In a digital polar modulation transmitter, an encoder converts a magnitude signal to a first 1-bit logic signal. A digital phase modulator modulates a carrier using a phase signal to generate a second 1-bit logic signal. A DUC upconverts the second 1-bit logic signal. A first-in first-out (FIFO) memory stores the first 1-bit logic signal. A combiner combines angle information contained in the second 1-bit logic signal with magnitude information contained in the first 1-bit logic signal stored in the FIFO memory. A DPA generates an RF signal based on the combined signal.

23 Claims, 5 Drawing Sheets

DIGITAL TRANSMITTER

CROSS REFERENCE TO RELATED APPLICATION

This application claims the benefit of U.S. Provisional Application No. 60/781,703 filed Mar. 13, 2006, which is incorporated by reference as if fully set forth.

FIELD OF INVENTION

The present invention is related to a wireless communication system. More particularly, the present invention is related to a digital transmitter.

BACKGROUND

Many different types of radio transmitters have been developed as shown in FIGS. 1A-1G. Conventional transmitters may be classified into either a constant envelop transmitter or a non-constant envelope transmitter, depending on the nature of the signal that the transmitter amplifies. The conventional transmitters shown in Figures 1A-1G employ analog and/or digital techniques to generate a signal.

FIG. 1A shows a conventional analog Cartesian modulation, direct conversion transmitter 110. The transmitter 110 may amplify both constant and non-constant envelope signals. The transmitter 110 employs an analog In-phase (I)/quadrature (Q) modulator. An efficient class B power amplifier may be used when amplifying a constant envelope signal and a class AB power amplifier may be employed when amplifying a non-constant envelope signal. I and Q components output by a modem 111 are converted to I and Q analog signals by digital-to-analog converters (DACs) 112. The I and Q analog signals are upconverted by mixers 113. The upconverted I and Q signals are combined and amplified by a variable gain amplifier (VGA) 114 and a power amplifier (PA) 115. Transmit power control (TPC) may be performed at the VGA 114. The amplified signal output by the PA 115 is filtered by a filter 116 and transmitted.

FIG. 1B shows a conventional constant envelope, analog polar modulation transmitter 120. Since the amplified signal is a constant envelope signal, only angle information is necessary in the polar representation of the signal. The angle information from a modem 121 is converted to an analog angle signal by a DAC 122. The analog angle signal is used to modulate a voltage controlled oscillator (VCO) 124 through a phase locked loop (PLL) 123. The modulated output of the VCO 124 is then amplified by a PA 125, (e.g., a class B PA). TPC may be implemented by varying the collector or drain voltage of the PA 125. The amplified signal output by the PA 125 is filtered by a filter 126 and transmitted.

FIG. 1C shows a conventional constant envelope, digital polar modulation transmitter 130. The angle information from a modem 131 is used to modulate a numerically controlled oscillator (NCO) 132. The multi-bit output of the NCO 132 is then fed to a TPC unit 133. The multi-bit output of the TPC unit 133 is then used to drive a high power DAC 134. The DAC 134 is used as a PA. The DAC reference voltage may be used to implement additional TPC functionality. The amplified signal output by the DAC 134 is filtered by a filter 135 and transmitted.

FIG. 1D shows a conventional non-constant envelope, analog polar modulation transmitter 140. This transmitter 140 is commonly known as an envelope elimination and restoration (EER) transmitter. Two signal paths are formed in the transmitter 140, a primary path and a supplementary path. An analog I/Q modulator is used in the primary path to form a signal which contains both the angle and magnitude information. I and Q components of the signal output by a modem 141 are converted to I and Q analog signals by DACs 142. The I and Q analog signals are upconverted by mixers 143. The upconverted I and Q signals are combined and passed through a limiter 144, where the magnitude information is eliminated. Only the angle information is retained at the output of the limiter 144. The output of the limiter 144 is then passed through a TPC unit 145 and fed into a PA 146, (e.g., a class AB PA).

The magnitude information of the signal is carried through a supplementary path. The I and Q components are fed into an envelope detector 147. The output of the envelope detector 147 retains only the magnitude information of the signal. The magnitude information is then converted to an analog form by a DAC 148 and combined with the angle information at the PA 146, (i.e., PA collector or drain). The combined signal is filtered by a filter 149 and transmitted.

FIG. 1E shows a conventional non-constant envelope, analog polar modulation transmitter 150. The angle information from a modem 151 is converted to an analog signal by a DAC 152a to modulate a VCO 154 through a PLL 153. The modulated VCO output is then passed through a TPC unit 155. The output of the TPC unit 155 drives a PA 156, (e.g., a class AB PA). The magnitude information from the modem 151 is converted to an analog form by a DAC 152b and combined with the angle information at the PA 156, (i.e., PA collector or drain). The combined signal is filtered by a filter 157 and transmitted.

FIG. 1F shows a conventional non-constant envelope, digital Cartesian modulation transmitter 160. A modem 161 outputs I and Q components of a signal. The I and Q components may be attenuated by multipliers 162 for TPC functionality. A 4-to-1 multiplexer 163 is used as an I/Q modulator. Both the true and the inverted forms of the I and Q components are input into the multiplexer 163. The multiplexer 163 sequentially passes one of the four input signals to the output in such a manner that a repeating pattern of I, Q, −I, −Q (or other sequences) results at the output. The multi-bit output of the multiplexer 163 is then converted to an analog form by a DAC 164. The DAC 164 is used as a PA. The DAC reference voltage may be used to implement additional TPC functionality. The amplified signal is filtered by a filter 165 and transmitted. U.S. Pat. No. 5,101,418 also discloses a transmitter including a digital quadrature frequency upconverter.

FIG. 1G shows a conventional non-constant envelope, digital polar modulation transmitter 170. The angle information from a modem 171 is used to modulate an NCO 173. The multi-bit output of the NCO 173 is then fed through a TPC unit 174. The multi-bit output of the TPC unit 174 is then used to drive a high power DAC 175. The magnitude information from the modem 171 is converted to an analog form by a DAC 172 and combined with the angle information at the DAC 175, (i.e., DAC reference voltage input). The DAC 175 is used as a PA. The amplified signal is filtered by a filter 176 and transmitted.

Conventional transmitters such as those disclosed hereinbefore deliver lower than desired power efficiency for on-constant envelope signals. Conventional transmitters often utilize analog circuit technology where repeatable performance is costly to achieve. Analog circuit technology-based conventional transmitters have low noise immunity compared to digital circuitry and therefore are difficult to integrate with a modem chip.

SUMMARY

The present invention is related to a digital transmitter. In one embodiment, a digital Cartesian modulation transmitter includes an encoder, a single bit digital modulator (SBDM), a digital upconverter (DUC) and a digital power amplifier (DPA). The encoder generates 1-bit logic signals from an I and Q signals from a modem. The SBDM multiplexes the 1-bit logic signals for Cartesian I/Q modulation. The DUC upconverts the multiplexed 1-bit logic signals. The DPA generates a radio frequency (RF) signal based on the upconverted signal.

In another embodiment, a digital polar modulation transmitter includes an encoder, a digital phase modulator (DPM), a DUC, a first-in first-out (FIFO) memory, a combiner and a DPA. The encoder converts a magnitude signal received from a modem to a first 1-bit logic signal. The DPM modulates a carrier using a phase signal received from the modem to generate a second 1-bit logic signal. The DUC upconverts the second 1-bit logic signal. The FIFO memory stores the first 1-bit logic signal and aligns the magnitude signal processed by the encoder with the phase signal processed by the DPM and the DUC. The combiner combines angle information contained in the second 1-bit logic signal with magnitude information contained in the first 1-bit logic signal stored in the FIFO memory and outputting a combined signal. The DPA generates an RF signal based on the combined signal.

BRIEF DESCRIPTION OF THE DRAWINGS

A more detailed understanding of the invention may be had from the following description of a preferred embodiment, given by way of example and to be understood in conjunction with the accompanying drawings wherein.

DETAILED DESCRIPTION OF THE PREFERRED EMBODIMENTS

The present invention employs digital signal generation (modulation) methods and standard digital circuit technology to implement radio frequency transmitter functional blocks. As compared to the conventional transmitters described above, the transmitter of the present invention is more power efficient, smaller in size, cost competitive, reduced complexity and deliver more repeatable performance.

Figure 1A:
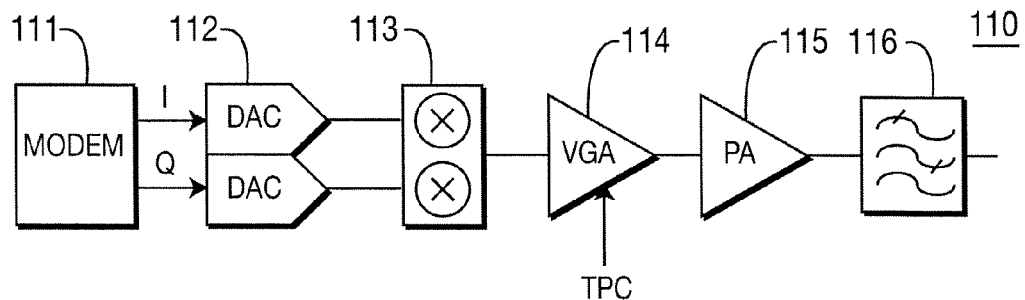
FIG. 1A shows a conventional analog Cartesian modulation, direct conversion transmitter.
Figure 1B:
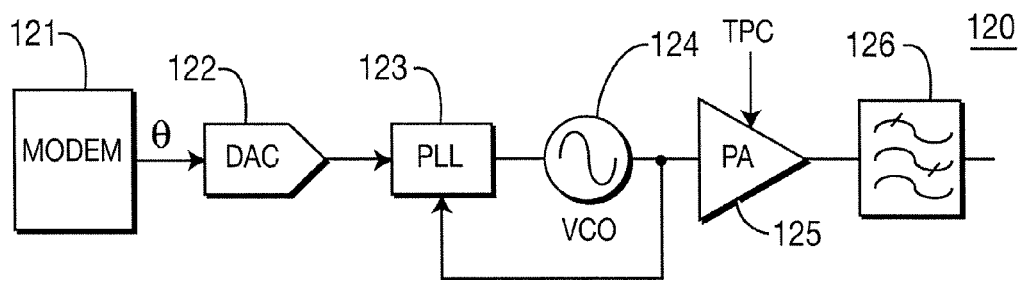
FIG. 1B shows a conventional constant envelope, analog polar modulation transmitter.
Figure 1C:
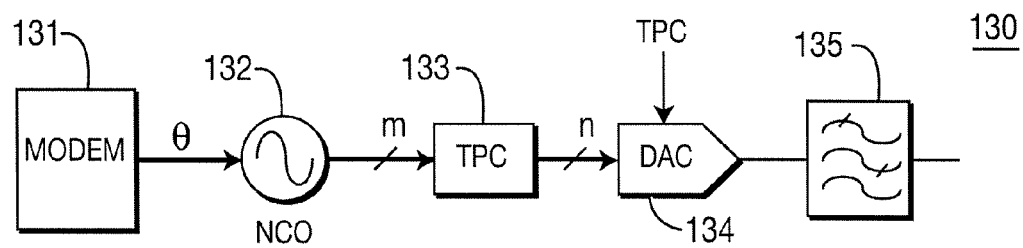
FIG. 1C shows a conventional constant envelope, digital polar modulation transmitter.
Figure 1D:
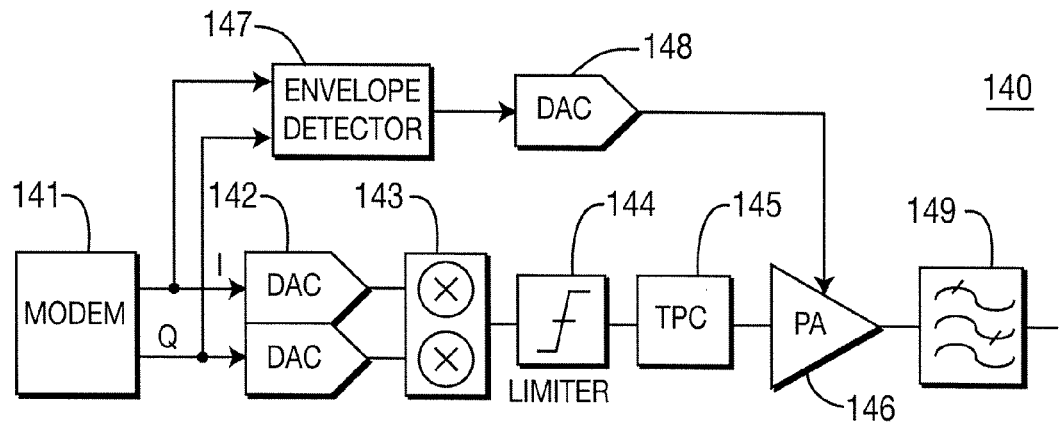
FIG. 1D shows a conventional non-constant envelope, analog polar modulation transmitter.
Figure 1E:
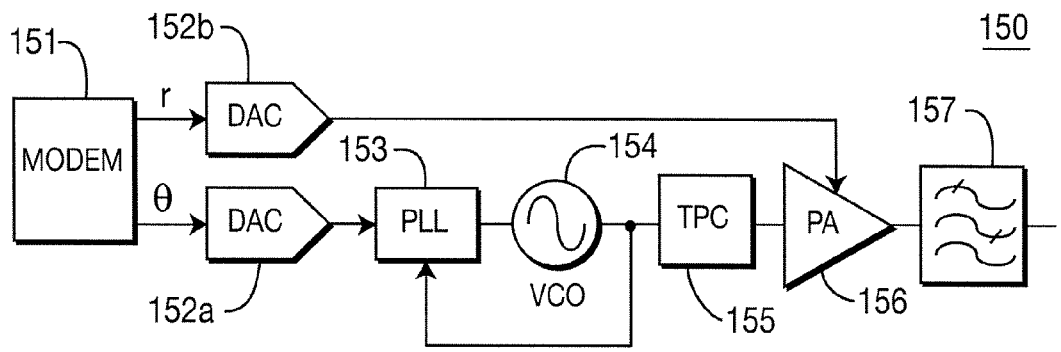
FIG. 1E shows a conventional non-constant envelope, analog polar modulation transmitter.
Figure 1F:
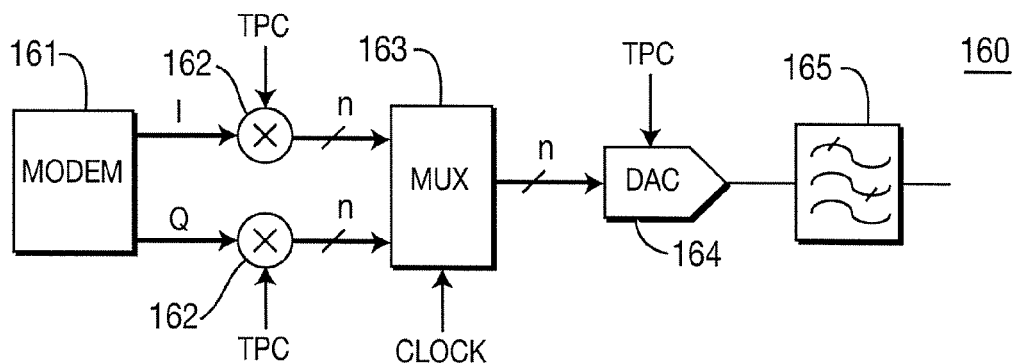
FIG. 1F shows a conventional non-constant envelope, digital Cartesian modulation transmitter.
Figure 1G:
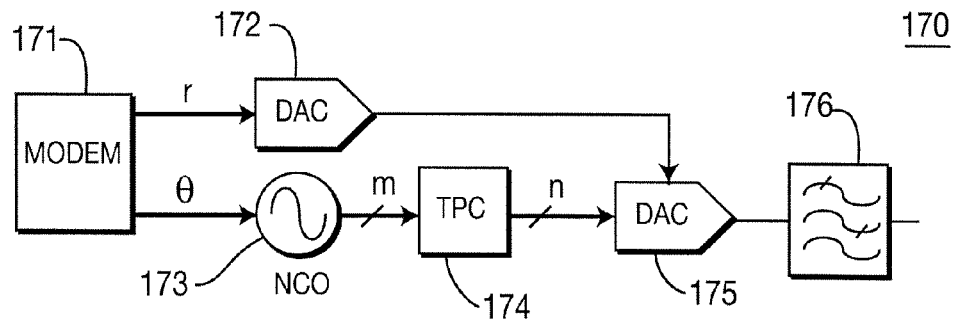
FIG. 1G shows a conventional non-constant envelope, digital polar modulation transmitter.
Figure 2:
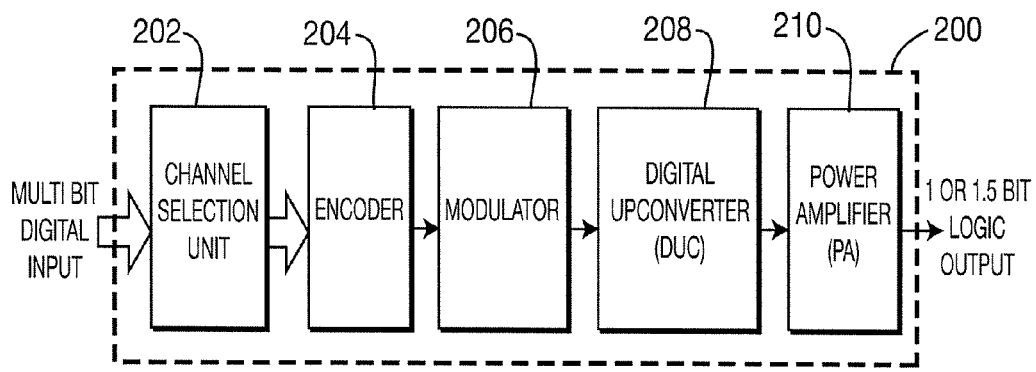
FIG. 2 is a functional block diagram of a transmitter in accordance with the present invention.

FIG. 2 is a functional block diagram of a transmitter 200 in accordance with the present invention. The transmitter 200 includes a channel selection unit 202, an encoder 204, a modulator 206, a DUC 208 and a PA 210. Each of these components will be explained in detail hereinafter. It should be noted that the order of components of the transmitter 200 may be changed and the functions performed by the components may be performed by more or less components or combined in one component. For example, the channel selection unit 202 may be incorporated into the modulator 206. The transmitter 200 receives multi-bit digital inputs from a modem (not shown) and outputs a 1 bit (or 1.5 bit) digital logic signal output. The transmitter 200 may handle inputs in both Cartesian and polar representation. The DUC 208 may handle double sideband or single sideband.

Figure 3:
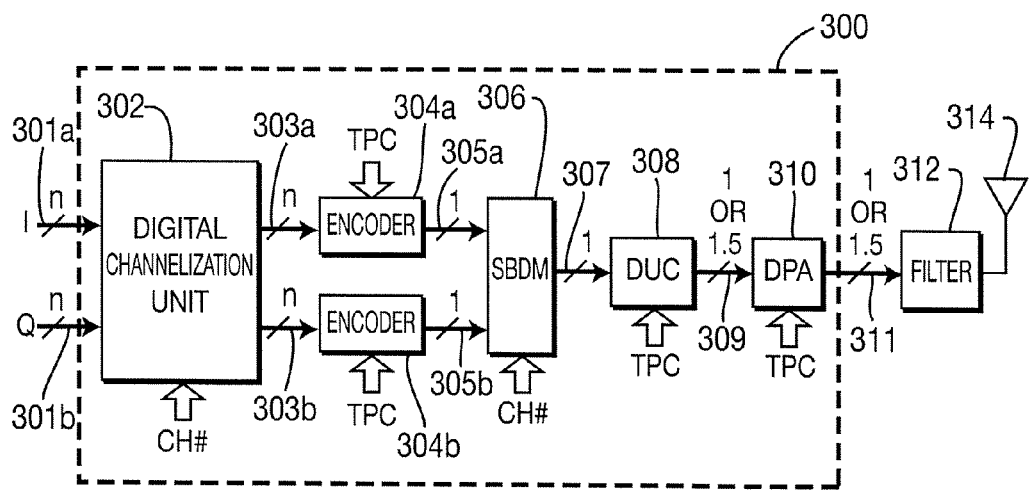
FIG. 3 is a block diagram of a digital Cartesian modulation transmitter in accordance with the present invention.

FIG. 3 is a block diagram of a digital Cartesian modulation transmitter 300 in accordance with the present invention. The transmitter 300 receives multi-bit I and Q signals 301a, 301b from a modem (not shown) and outputs a 1 bit, (or 1.5 bit), digital logic signal 311 to a filter 312 which is connected to an antenna 314. The transmitter 300 may amplify constant or non-constant envelope signals, and may be built entirely from standard digital circuitry.

The transmitter 300 includes a digital channelization unit 302, encoders 304a, 304b, an SBDM 306, a DUC 308, and a DPA 310. The digital channelization unit 302 receives multi-bit digital I and Q signals from a modem (not shown). The digital channelization unit 302 selects a frequency channel to transmit a signal based on a command from the modem. The channelization unit 302 includes a complex multiplier, adders, phase shifters and an NCO, and performs baseband channelization.

The output 303a, 303b of the channelization unit 302 is then fed into the encoders 304a, 304b. The encoders 304a, 304b convert the multi-bit input signals into high speed 1-bit logic signals. The encoders 304a, 304b may be a delta modulator, a sigma delta modulator, a pulse width modulator, a pulse position modulator, a pulse duration modulator, or any type of modulator. The encoders 304a, 304b may optionally perform a TPC function based on a TPC command from the modem.

The 1-bit logic signals 305a, 305b from the encoders 304a, 304b are fed into the SBDM 306. The SBDM 306 functions as a Cartesian I/Q modulator. The SBDM 306 may optionally perform a channel selection function based on a channel selection command from the modem.

Figure 4:
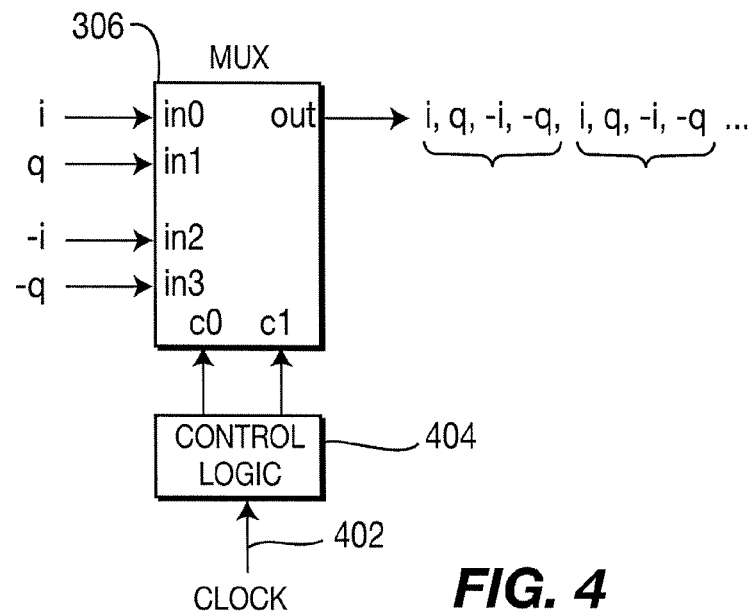
FIG. 4 shows an exemplary SBDM used in the transmitter of FIG. 3 in accordance with the present invention.

FIG. 4 shows an exemplary SBDM 306 of the transmitter of FIG. 3 in accordance with the present invention. Referring to FIGS. 3 and 4, a 4-to-1 multiplexer 400 is used as a Cartesian I/Q modulator. In accordance with one embodiment, the two encoders 304a and 304b of the transmitter 300 output I and Q signals, respectively, and an inverted version of the I and Q signals are generated by inverters (not shown in FIG. 3), (i.e., the encoder 304a outputs I signal and the I signal is inverted by an inverter (not shown in FIG. 3) and the encoder 304b outputs Q signal and the Q signal is inverted by an inverter (not shown in FIG. 3)). The I, Q, −I, −Q signals are fed to the inputs, (in0, in1, in2, in3), of the multiplexer 400, respectively. A clock signal 402 is input into control inputs c0, c1 of the multiplexer 400 via control logic 404 in such a way that a repeating sequence of I, Q, −I, −Q, (alternatively Q, I, −Q, −I, or other sequence), is output from the multiplexer 400. It should be noted that the multiplexer 400 of FIG. 4 is provided as an exemplary SBDM and any other implementations of the SBDM are possible.

Alternatively, four encoders may be provided in the transmitter 300 and the four encoders receive multi-bit I, Q, −I and −Q signals from the modem, respectively, and output encoded 1-bit logic I, Q, −I and −Q signals to the multiplexer 400.

Referring to FIG. 3, the 1-bit logic signal 307 from the SBDM 306 is then fed into the DUC 308. The DUC 308 upconverts the 1-bit logic signal 307 from the SBDM 306 to a higher frequency signal 309, (1 bit or 1.5 bit logic signal). The DUC 308 may be classified as either image suppressing, (i.e., single side band), or non image suppressing, (i.e., double side band). The DUC 308 may optionally perform TPC functions based on a power control command from the modem.

Figure 5:
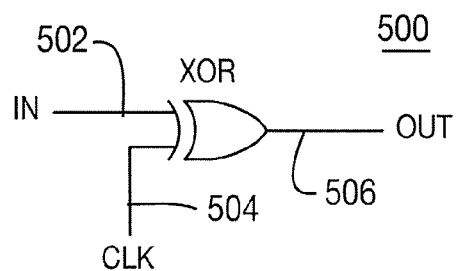
FIG. 5 shows an exemplary DUC in accordance with the present invention.

FIG. 5 shows an exemplary DUC 500 in accordance with the present invention. Referring to FIGS. 3 and 5, an exclusive OR (XOR) gate 500 is the simplest implementation of the double side band DUC. The output 502 from the SBDM 306 and a clock signal 504 are input into the two inputs of the XOR gate 500 to generate an XORed signal 506.

As shown in FIG. 3, the upconverted 1-bit, (or 1.5-bit), logic signal 309 from the DUC 308 is then used to drive the DPA 310. The DPA 310 generates a 1-bit, (or 1.5 bit), RF signal 311 based on the upconverted signal 309 from the DUC 308. The DPA 310 may be constructed from logic gates, clocked logic elements like a multiplexer, switches, or switch mode analog amplifiers.

Figure 6:
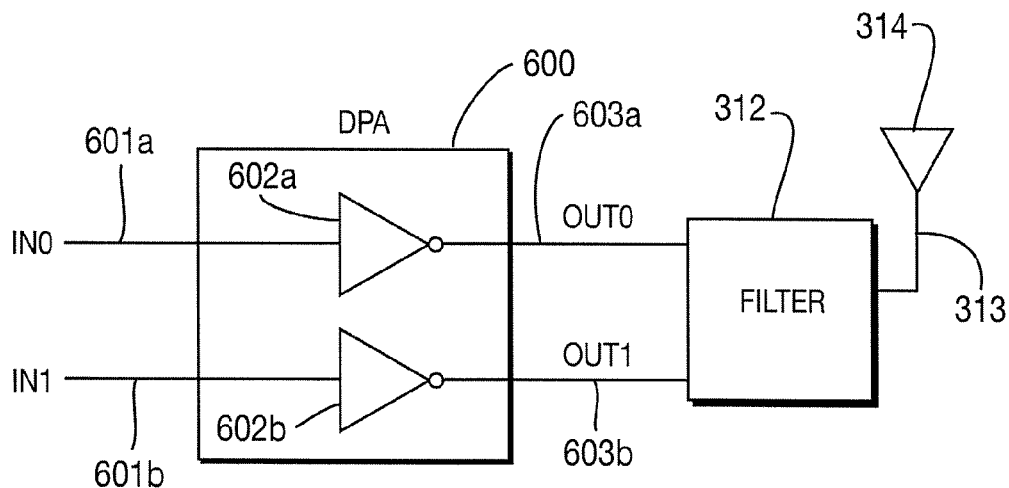
FIGS. 6 shows an exemplary DPA in accordance with the present invention.

FIG. 6 shows an exemplary DPA 600 in accordance with the present invention. In this example, the DPA 600 is implemented with a plurality of inverters 602a, 602b. In a 1-bit logic operation, true and inverted versions of the upconverted signal 309 from the DUC 308 is applied to each input, (in0, in1), 601a, 601b of the two inverters 602a, 602b, respectively. The filter 312 differentially combines the outputs 603a, 603b from the inverters 602a, 602b. The differentially combined signal 313 is then transmitted via the antenna 314. To generate a third logic level required for the 1.5 bit logic operation, both inputs 601a and 601b of the inverters 602a and 602b are driven with the same signal. A power control function may optionally be performed in the DPA 310 based on a power control command from a modem.

Figure 7:
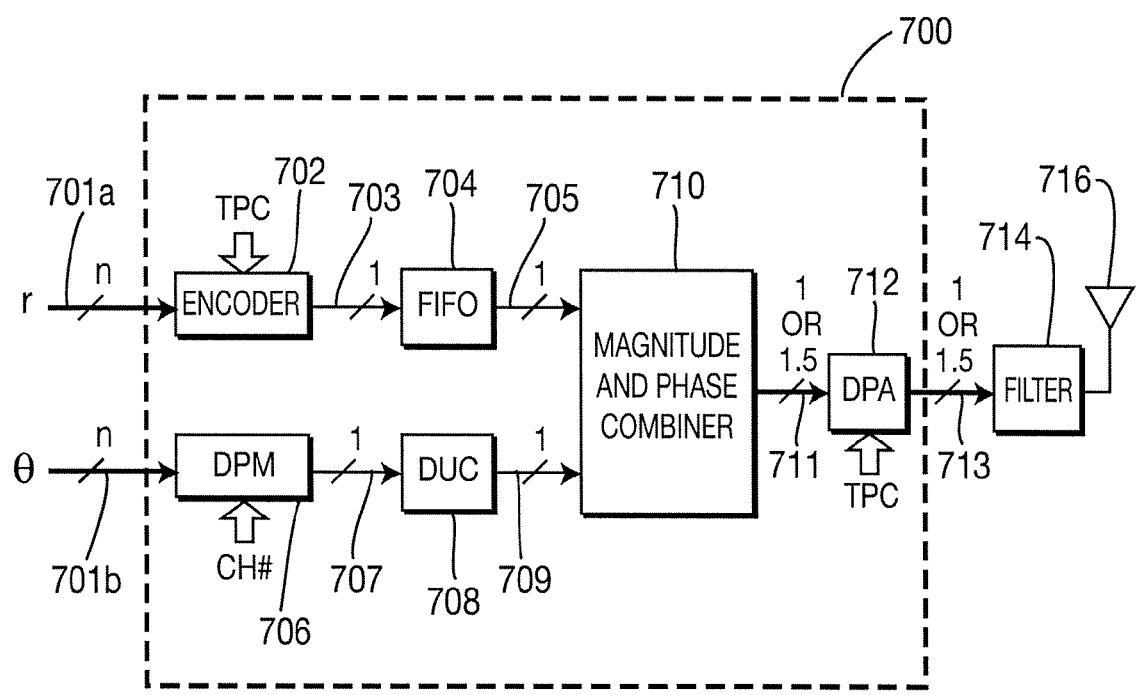
FIG. 7 is a block diagram of a digital polar modulation transmitter in accordance with the present invention.

FIG. 7 is a block diagram of a digital polar modulation transmitter 700 in accordance with one embodiment of the present invention. Symbols output from a modem (not shown) are represented in a polar coordinate with a multi-bit magnitude (r) signal 701a and a multi-bit phase (θ) signal 701b. The transmitter 700 receives the multi-bit magnitude signal 701a and the multi-bit phase signal 701b from the modem (not shown) and outputs a 1 bit, (or 1.5 bit), digital logic signal to a filter 714 which is connected to an antenna 716. The transmitter 700 may amplify constant and non-constant envelope signals and may be built entirely from standard digital circuit technology.

Referring to FIG. 7, the transmitter 700 includes an encoder 702, a FIFO memory 704, a DPM 706, a DUC 708, a magnitude and phase combiner 710, and a DPA 712. The encoder 702 receives a multi-bit magnitude signal 701a from a modem (not shown) and converts the multi-bit magnitude signal 701a into a high speed 1-bit logic signal 703. The encoder 702 may be a delta modulator, a sigma delta modulator, a pulse width modulator, a pulse position modulator, a pulse duration modulator, or any other modulator. The encoder 702 may optionally perform a TPC function based on a TPC command from the modem (not shown).

A multi-bit phase signal 701b is used to drive the DPM 706. The DPM 706 performs a phase modulation of a carrier using the multi-bit phase signal 701b and outputs a 1-bit logic signal 707. The DPM 706 may optionally perform a channel selection function to select a specific channel frequency based on a channel selection command from the modem (not shown). The DPM 706 may be implemented with a direct digital synthesizer (DDS), a phase locked loop (PLL)/voltage controlled oscillator (VCO), or the like.

As shown in FIG. 7, the 1-bit logic signal 707 from the DPM 706 is then fed into the DUC 708. The DUC 708 upconverts the 1-bit logic signal from the DPM 706 to a higher frequency signal, (1-bit logic signal). The DUC 708 maybe classified as either image suppressing, (i.e., single side band), or non image suppressing, (i.e., double side band). The exclusive OR (XOR) gate 500 of FIG. 5 may be used as the DUC 708. The DUC 708 may optionally perform a TPC function based on a TPC command from the modem.

The 1-bit logic signal 703 from the encoder 702 is fed into the FIFO memory 704. The output 705 of the FIFO memory 704 is connected to the magnitude and phase combiner 710. The FIFO memory 704 aligns the magnitude signal processed by the encoder 702 with the phase signal processed by the DPM 706 and the DUC 708.

The phase information contained in the 1-bit logic signal 709 from the DUC 708 is then combined with the magnitude information contained in the 1-bit logic signal 705 output by the FIFO memory 704. The magnitude and phase combiner 710 outputs a 1-bit, (or 1.5-bit), logic signal 711. A 1-bit multiplier, an XOR gate, a multiplexer, or the like, may be used as the magnitude and phase combiner 710.

The combiner output 711 is used to drive the DPA 712. The DPA 712 generates a 1-bit, (or 1.5 bit), RF signal 713 based on the output 711 from the magnitude and phase combiner 710. The DPA 712 may be constructed from logic gates, clocked logic elements like a multiplexer, switches, or switch mode analog amplifiers. The DPA 600 of FIG. 6 may be used.

Alternatively, the DUC 708 may be placed after the magnitude and phase combiner 710.

The present invention may be implemented in any type of wireless communication system including, but not limited to, wideband code division multiple access (WCDMA), time division duplex (TDD), high chip rate (HCR), low chip rate (LCR), time division synchronous code division multiple access (TDS-CDMA), frequency division duplex (FDD), CDMA2000, global system for mobile communication (GSM), enhanced data rates for GSM evolution (EDGE), global packet radio services (GPRS), orthogonal frequency division multiplexing (OFDM), multiple-input multiple-output (MIMO), or any other type of wireless communication system.

The transmitter may be included in a wireless transmit/receive unit (WTRU) or a base station. The terminology "WTRU" includes but is not limited to a user equipment (UE), a mobile station (STA), a fixed or mobile subscriber unit, a pager, a cellular telephone, a personal digital assistant (PDA), a computer, or any other type of user device capable of operating in a wireless environment. The terminology "base station" includes but is not limited to a Node-B, a site controller, an access point (AP), or any other type of interfacing device capable of operating in a wireless environment.

Although the features and elements of the present invention are described in the preferred embodiments in particular combinations, each feature or element can be used alone without the other features and elements of the preferred embodiments or in various combinations with or without other features and elements of the present invention. The methods or flow charts provided in the present invention may be implemented in a computer program, software, or firmware tangibly embodied in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) module.

What is claimed is:

1. A digital transmitter comprising:
    an encoder for converting a magnitude signal received from a modem to a first 1-bit logic signal;
    a digital phase modulator (DPM) for modulating a carrier using a phase signal received from the modem to generate a second 1-bit logic signal;
    a digital upconverter (DUC) for upconverting the second 1-bit logic signal;
    a first-in first-out (FIFO) memory for storing the first 1-bit logic signal and aligning the magnitude signal processed by the encoder with the phase signal processed by the DPM and the DUC;
    a magnitude and phase combiner for combining angle information contained in the second 1-bit logic signal with magnitude information contained in the first 1-bit logic signal stored in the FIFO memory and outputting a combined signal; and
    a digital power amplifier (DPA) for generating a radio frequency (RF) signal based on the combined signal.

2. The digital transmitter of claim 1 wherein the DPM performs a channel selection function to select a specific channel frequency based on a channel selection command from the modem.

3. The digital transmitter of claim 1 wherein the DPM is one of a direct digital synthesizer (DDS) and a phase locked loop (PLL)/voltage controlled oscillator (VCO).

4. The digital transmitter of claim 1 wherein the encoder is one of a delta modulator, a sigma delta modulator, a pulse width modulator, a pulse position modulator, and a pulse duration modulator.

5. The digital transmitter of claim 1 wherein the encoder implements a transmit power control (TPC) function based on a TPC command from the modem.

6. The digital transmitter of claim 1 wherein the DUC outputs a 1-bit logic signal.

7. The digital transmitter of claim 1 wherein the DUC is a single side band processor.

8. The digital transmitter of claim 1 wherein the DUC is a double side band processor.

9. The digital transmitter of claim 8 wherein the DUC is an exclusive OR (XOR) gate that performs XOR operations on a phase modulated carrier signal and a clock signal.

10. The digital transmitter of claim 1 wherein the DUC performs a TPC function based on a power control command from the modem.

11. The digital transmitter of claim 1 wherein the DPA comprises a plurality of inverters that are controlled digitally.

12. The digital transmitter of claim 11 wherein the DPA implements a 1-bit logic operation and true and inverted versions of the upconverted signal are applied to each input of two inverters, respectively.

13. The digital transmitter of claim 11 wherein the DPA implements a 1.5 bit logic operation and both inputs of two inverters are driven with the upconverted signal.

14. The digital transmitter of claim 11 wherein a voltage supply to the inverters are controlled to control a gain of the DPA.

15. The digital transmitter of claim 1 wherein the DPA performs a power control function based on a power control command from a modem.

16. The digital transmitter of claim 1 wherein the magnitude and phase combiner is one of a 1-bit multiplier, an exclusive OR (XOR) gate, and a multiplexer.

17. A digital transmitter comprising:
    an encoder for converting a magnitude signal received from a modem to a first 1-bit logic signal;
    a digital phase modulator (DPM) for modulating a carrier using a phase signal received from the modem to generate a second 1-bit logic signal;
    a first-in first-out (FIFO) memory for storing the first 1-bit logic signal and aligning the magnitude signal processed by the encoder with the phase signal processed by the DPM;
    a magnitude and phase combiner for combining angle information contained in the second 1-bit logic signal with magnitude information contained in the first 1-bit logic signal stored in the FIFO memory and outputting a combined signal;
    a digital upconverter (DUC) for upconverting the combined signal; and
    a digital power amplifier (DPA) for generating a radio frequency (RF) signal based on the upconverted combined signal.

18. A method for transmitting a signal with a digital transmitter, the method comprising:
    converting a magnitude signal received from a modem to a first 1-bit logic signal;
    modulating a carrier using a phase signal received from the modem to generate a second 1-bit logic signal;
    upconverting the second 1-bit logic signal;
    storing the first 1-bit logic signal in a first-in first-out (FIFO) memory for aligning the magnitude signal with the phase signal;

combining angle information contained in the second 1-bit logic signal with magnitude information contained in the first 1-bit logic signal stored in the FIFO memory to generate a combined signal; and generating a radio frequency (RF) signal based on the combined signal.

19. The method of claim 18 further comprising:

performing a channel selection function to select a specific channel frequency based on a channel selection command from the modem while modulating the carrier.

20. The method of claim 18 further comprising:

performing a transmit power control (TPC) function based on a TPC command from the modem.

21. The method of claim 20 wherein the TPC function is performed while the first 1-bit logic signal is generated.

22. The method of claim 20 wherein the TPC function is performed while the RF signal is generated.

23. A method for transmitting a signal with a digital transmitter, the method comprising:

converting a magnitude signal received from a modem to a first 1-bit logic signal;

modulating a carrier using a phase signal received from the modem to generate a second 1-bit logic signal;

storing the first 1-bit logic signal and aligning the magnitude signal with the phase signal;

combining angle information contained in the second 1-bit logic signal with magnitude information contained in the first 1-bit logic signal and outputting a combined signal;

upconverting the combined signal; and generating a radio frequency (RF) signal based on the upconverted combined signal.

* * * * *